US012635417B2

(12) United States Patent
Sung

(10) Patent No.: US 12,635,417 B2
(45) Date of Patent: May 19, 2026

(54) REPOLING DRIVING DEVICE AND DRIVING METHOD THEREOF

(71) Applicants: INTERFACE TECHNOLOGY (CHENGDU) CO., LTD., Chengdu City (CN); INTERFACE OPTOELECTRONICS (SHENZHEN) CO., LTD., Shenzhen City (CN); GENERAL INTERFACE SOLUTION LIMITED, Zhunan Township (TW)

(72) Inventor: Chu Jen Sung, Shenzhen City (CN)

(73) Assignees: Interface Technology (Chengdu) Co., Ltd., Chengdu City (CN); Interface Optoelectronics (Shenzhen) Co., Ltd., Shenzhen City (CN); General Interface Solution Limited, Miaoli County (TW)

( * ) Notice: Subject to any disclaimer, the term of this patent is extended or adjusted under 35 U.S.C. 154(b) by 852 days.

(21) Appl. No.: 18/052,027

(22) Filed: Nov. 2, 2022

(65) Prior Publication Data

US 2024/0114798 A1 Apr. 4, 2024

(30) Foreign Application Priority Data

Sep. 29, 2022 (CN) .......................... 202211200342.9

(51) Int. Cl.
| | |
|---|---|
| *H10N 30/00* | (2023.01) |
| *H10N 30/045* | (2023.01) |
| *H10N 30/80* | (2023.01) |
| *H10N 30/85* | (2023.01) |
| *H10N 30/853* | (2023.01) |

(52) U.S. Cl.
CPC ......... *H10N 30/802* (2023.02); *H10N 30/045* (2023.02); *H10N 30/852* (2023.02); *H10N 30/853* (2023.02)

(58) Field of Classification Search
CPC .. H10N 30/802; H10N 30/045; H10N 30/852; H10N 30/853; H02N 2/067; H02N 2/02; H02N 2/04
See application file for complete search history.

(56) References Cited

U.S. PATENT DOCUMENTS

| | | | | |
|---|---|---|---|---|
| 2010/0007242 | A1* | 1/2010 | Hori ..................... | H10N 30/101 |
| | | | | 310/317 |
| 2011/0220275 | A1* | 9/2011 | Hayakawa .............. | C30B 31/20 |
| | | | | 156/247 |

FOREIGN PATENT DOCUMENTS

JP 2013240225 A * 11/2013

* cited by examiner

*Primary Examiner* — Julio C. Gonzalez
(74) *Attorney, Agent, or Firm* — Rosenberg, Klein & Lee

(57) ABSTRACT

A repoling driving device and a method thereof is disclosed. The repoling driving device, coupled to a piezoelectric element, includes a piezoelectric driver, a processor, and a current detector. The piezoelectric driver is coupled to the piezoelectric element. The processor is coupled to the piezoelectric driver. The processor drives the piezoelectric driver to generate a driving voltage. The piezoelectric element receives the driving voltage to generate an output current. The current detector is coupled to the piezoelectric element and the processor. The current detector receives the output current. When the output current is less than a given current, the current detector generates and transmits a repoling signal to the processor. The processor controls the piezoelectric driver to repolarize the piezoelectric element in response to the repoling signal.

11 Claims, 8 Drawing Sheets
(4 of 8 Drawing Sheet(s) Filed in Color)

REPOLING DRIVING DEVICE AND DRIVING METHOD THEREOF

This application claims priority of Application No. 202211200342.9 filed in Mainland China on 29 Sep. 2022 under 35 U.S.C. § 119; the entire contents of all of which are hereby incorporated by reference.

BACKGROUND OF THE INVENTION

Field of the Invention

The present invention relates to driving technology, particularly to a repoling driving device and a driving method thereof.

Description of the Related Art

With the needs of human nature and the advancement of technology, the functions of mobile phones have also improved rapidly. The functions lay constant emphasis on the interaction between technology and human nature. For example, people expect that the mobile phone can respond timely when playing games or using certain functions on the screen. Thus, people can have further interaction with the mobile phone. One of the most immediate responses is that the mobile phone appropriately vibrates. At present, the way to make a mobile phone vibrate is nothing more than using an eccentric rotating mass (ERM) or a piezoelectric element to achieve the vibration effect. Piezoelectric elements are the best choice for faster response.

The special arrangement of atoms in the lattice makes the piezoelectric material have the effect of coupling the stress field and the electric field, which is called the piezoelectric effect. At present, piezoelectric materials are mainly driven by DC and AC signals according to the application mode of the product. The DC-driven piezoelectric materials are mostly used in high-precision products. The AC-drive piezoelectric materials are commonly used in products that operate for a long time. Piezoelectric materials must be polarized to have piezoelectric properties. The so-called polarization (i.e., poling) is to apply a strong DC electric field to the piezoelectric material, so that the electric domains in the piezoelectric material are arranged in the direction of the electric field. The poling is also known as artificial polarization treatment or single domain treatment. The driving method of the piezoelectric element is to use a voltage across the piezoelectric material to form an electric field to make the piezoelectric element vibrate. As the applied voltage increases, the vibration strength increases. Under the influence of electric field, heat and machinery, the piezoelectric material will have the problem with depolarization. Therefore, the vibration intensity of the piezoelectric element decreases the piezoelectric effect declines, the capacitance of the piezoelectric material decreases, and the performance of the piezoelectric element decreases.

To overcome the abovementioned problems, the present invention provides a repoling driving device and a driving method thereof, so as to solve the afore-mentioned problems of the prior art.

SUMMARY OF THE INVENTION

The present invention provides a repoling driving device and a driving method thereof, which maintain the piezoelectric effect of a piezoelectric element when the piezoelectric is depolarized.

In an embodiment of the present invention, a repoling driving device is coupled to a piezoelectric element. The repoling driving device includes a piezoelectric driver, a processor, and a current detector. The piezoelectric driver is coupled to the piezoelectric element. The processor is coupled to the piezoelectric driver and configured to control the piezoelectric driver to generate a driving voltage. The piezoelectric element is configured to receive the driving voltage to generate an output current. The current detector is coupled to the piezoelectric element and the processor and configured to receive the output current. When the output current is less than a given current, the current detector generates a repoling signal and transmits the repoling signal to the processor. The processor controls the piezoelectric driver to repolarize the piezoelectric element in response to the repoling signal.

In an embodiment of the present invention, the processor controls the piezoelectric driver to repolarize the piezoelectric element before the piezoelectric driver generates the driving voltage.

In an embodiment of the present invention, the piezoelectric driver includes a driving circuit, a repoling circuit, and a selector. The driving circuit is coupled to the processor. The processor is configured to control the driving circuit to generate the driving voltage. The repoling circuit is coupled to the processor. The processor is configured to control the repoling circuit to generate a repoling voltage in response to the repoling signal. The selector is coupled to the piezoelectric element, the processor, the driving circuit, and the repoling circuit. The processor is configured to control the selector to select the driving voltage or the repoling voltage. The selector is configured to apply the driving voltage to the piezoelectric element to generate the output current or to apply the repoling voltage to the piezoelectric element to repolarize the piezoelectric element.

In an embodiment of the present invention, the driving circuit is a sinusoidal pulse width modulation generator.

In an embodiment of the present invention, the driving circuit includes a 555 pulse width modulator and an amplifier. The 555 pulse width modulator is coupled to the processor. The processor is configured to control the 555 pulse width modulator to generate a pulse width modulation signal. The amplifier is coupled to the 555 pulse width modulator and the selector and configured to receive and amplify the pulse width modulation signal to generate the driving voltage.

In an embodiment of the present invention, the driving circuit includes a Wien-bridge oscillator and an amplifier. The Wien-bridge oscillator is coupled to the processor. The processor is configured to control the Wien-bridge oscillator to generate an oscillation signal. The amplifier is coupled to the Wien-bridge oscillator and the selector and configured to receive and amplify the oscillation signal to generate the driving voltage.

In an embodiment of the present invention, the repoling circuit is a charge pump.

In an embodiment of the present invention, the selector is a multiplexer.

In an embodiment of the present invention, the current detector includes a current-to-voltage converter and a voltage comparator. The current-to-voltage converter is coupled to the piezoelectric element and configured to receive the output current and convert the output current into an output voltage. The voltage comparator is coupled to the current-to-voltage converter and the processor and configured to receive the output voltage and a given voltage corresponding to the given current. When the output voltage is less than the given voltage, the voltage comparator generates the repoling signal.

In an embodiment of the present invention, the processor is configured to control the piezoelectric driver to repolarize the piezoelectric element in response to the repoling signal at least two times.

In an embodiment of the present invention, the driving voltage is a square-wave voltage or a sinusoidal-wave voltage.

In an embodiment of the present invention, the piezoelectric element includes quartz, tourmaline, zinc oxide, polymers, ceramic materials or composite materials.

In an embodiment of the present invention, a repoling driving method includes: applying a driving voltage to a piezoelectric element to generate an output current; determining whether the output current is less than a given current: if yes, generating a repoling signal; and if no, returning to the step of applying the driving voltage to the piezoelectric element to generate the output current; and receiving the repoling signal to repolarize the piezoelectric element.

In an embodiment of the present invention, the piezoelectric element is repolarized before the step of applying the driving voltage to the piezoelectric element.

In an embodiment of the present invention, the step of applying the driving voltage to the piezoelectric element includes generating a pulse width modulation signal; and amplifying the pulse width modulation signal to generate the driving voltage and applying the driving voltage to the piezoelectric element.

In an embodiment of the present invention, the step of applying the driving voltage to the piezoelectric element includes: generating an oscillation signal; and amplifying the oscillation signal to generate the driving voltage and applying the driving voltage to the piezoelectric element.

In an embodiment of the present invention, the step of determining whether the output current is less than the given current includes: converting the output current into an output voltage; and determining whether the output voltage is less than a given voltage corresponding to the given current, so as to determine whether the output current is less than the given current.

In an embodiment of the present invention, the step of repoling the piezoelectric element is performed at least two times.

In an embodiment of the present invention, the driving voltage is a square-wave voltage or a sinusoidal-wave voltage.

In an embodiment of the present invention, the piezoelectric element includes quartz, tourmaline, zinc oxide, polymers, ceramic materials or composite materials.

To sum up, the repoling driving device and the driving method thereof repolarize the piezoelectric element to maintain the piezoelectric effect of the piezoelectric element when the piezoelectric is depolarized.

Below, the embodiments are described in detail in cooperation with the drawings to make easily understood the technical contents, characteristics and accomplishments of the present invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE INVENTION

Figure 1:
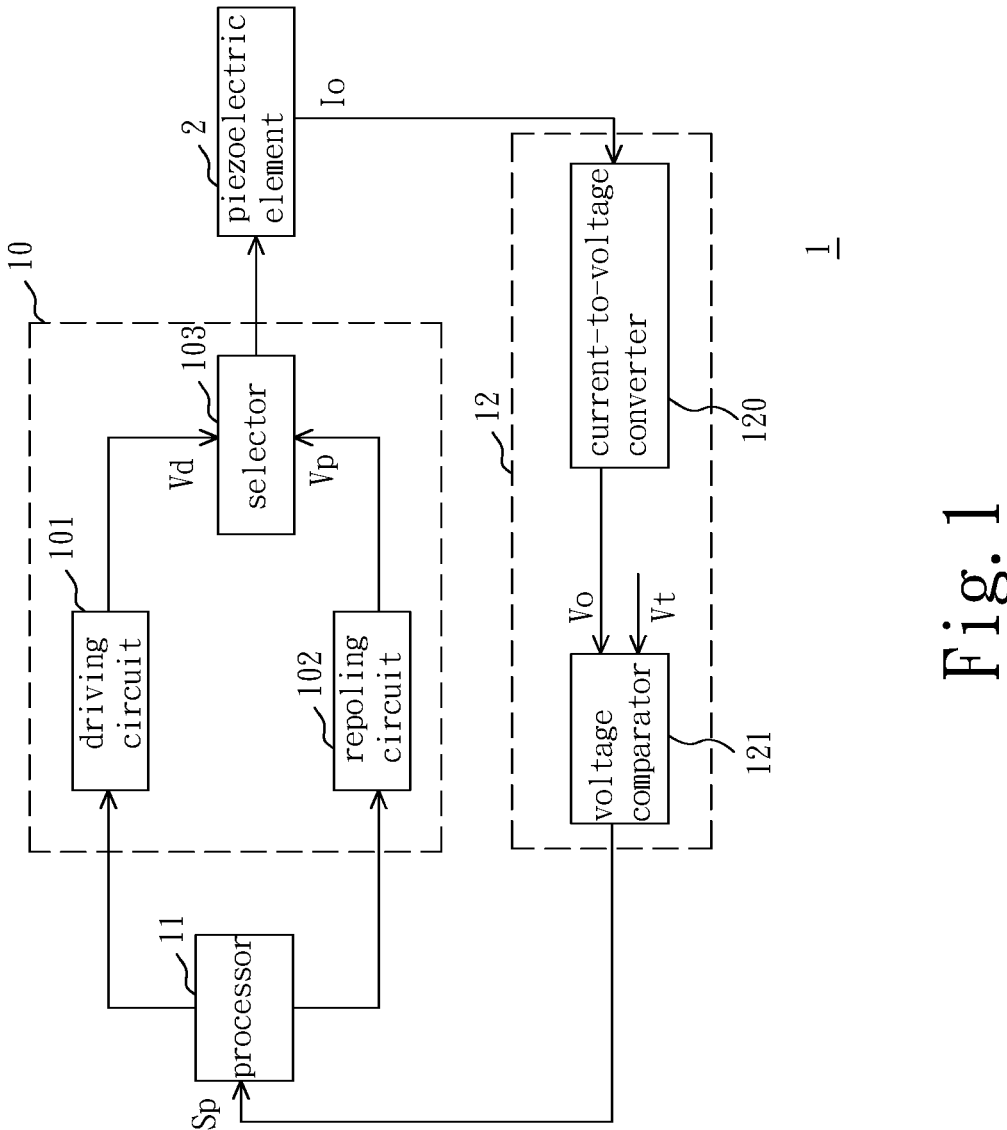
FIG. 1 is a schematic diagram illustrating a repoling driving device according to a first embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

When an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

In addition, the term "electrically coupled" can be referring to either directly connecting or indirectly connecting between elements. Thus, if it is described in the below contents of the present invention that a first device is electrically coupled to a second device, the first device can be directly connected to the second device, or indirectly connected to the second device through other devices or means. Moreover, when the transmissions or generations of electrical signals are mentioned, one skilled in the art should understand some degradations or undesirable transformations could be generated during the operations. If it is not specified in the specification, an electrical signal at the transmitting end should be viewed as substantially the same signal as that at the receiving end. For example, when the end A of an electrical circuit provides an electrical signal S to the end B of the electrical circuit, the voltage of the electrical signal S may drop due to passing through the source and drain of a transistor or due to some parasitic capacitance. However, the transistor is not deliberately used to generate the effect of degrading the signal to achieve some result, that is, the signal S at the end A should be viewed as substantially the same as that at the end B.

Furthermore, it can be understood that the terms "comprising," "including," "having," "containing," and "involving" are open-ended terms, which refer to "may include but is not limited to so." In addition, each of the embodiments or claims of the present invention is not necessary to achieve all the effects and advantages possibly to be generated, and the abstract and title of the present invention is used to assist for patent search and is not used to further limit the claimed scope of the present invention.

When a piezoelectric element operates at a resonant frequency, the output current of the piezoelectric element is maximized. When the piezoelectric element is depolarized, the output current is decreased. A repoling driving device and a driving method thereof are introduced as follows, which repolarize the piezoelectric element to maintain the piezoelectric effect of the piezoelectric element when the piezoelectric is depolarized.

FIG. 1 is a schematic diagram illustrating a repoling driving device according to a first embodiment of the present invention. Referring to FIG. 1, the first embodiment of a repoling driving device 1 is introduced as follows. The repoling driving device 1 is coupled to a piezoelectric element 2. The piezoelectric element 2 includes quartz, tourmaline, zinc oxide, polymers, ceramic materials or composite materials, but the present invention is not limited thereto. The repoling driving device 1 includes a piezoelectric driver 10, a processor 11, and a current detector 12. The piezoelectric driver 10 is coupled to the piezoelectric element 2. The processor 11 is coupled to the piezoelectric driver 10. The current detector 12 is coupled to the piezoelectric element 2 and the processor 11. The processor 11 controls the piezoelectric driver 10 to generate a driving voltage Vd. The piezoelectric element 2 receives the driving voltage Vd to generate an output current Io. The driving voltage Vd may be a square-wave voltage or a sinusoidal-wave voltage. The current detector 12 receives the output current Io. When the output current Io is less than a given current, the current detector 12 generates a repoling signal Sp and transmits the repoling signal Sp to the processor 11. The processor 11 controls the piezoelectric driver 10 to repolarize the piezoelectric element 2 in response to the repoling signal Sp, so as to recover the piezoelectric properties of the piezoelectric element 2. For example, the processor 11 may control the piezoelectric driver 10 to repolarize the piezoelectric element 2 in response to the repoling signal Sp at least two times.

The processor 11 may control the piezoelectric driver 10 to repolarize the piezoelectric element 2 to guarantee the piezoelectric element 2 with the best piezoelectric properties before the piezoelectric driver 10 generates the driving voltage Vd.

In some embodiment of the present invention, the current detector 12 may include a current-to-voltage converter 120 and a voltage comparator 121. The current-to-voltage converter 120 is coupled to the piezoelectric element 2. The voltage comparator 121 is coupled to the current-to-voltage converter 120 and the processor 11. The current-to-voltage converter 120 receives the output current Io and converts the output current Io into an output voltage Vo. The voltage comparator 121 receives the output voltage Vo and a given voltage Vt corresponding to the given current. When the output voltage Vo is less than the given voltage Vt, the voltage comparator 121 generates the repoling signal Sp.

In some embodiment of the present invention, the piezoelectric driver 10 may include a driving circuit 101, a repoling circuit 102, and a selector 103. The selector 103 may be, but not limited to, a multiplexer. The driving circuit 101 is coupled to the processor 11. The repoling circuit 102 is coupled to the processor 11. The selector 103 is coupled to the piezoelectric element 2, the processor 11, the driving circuit 101, and the repoling circuit 102. The processor 11 controls the driving circuit 101 to generate the driving voltage Vd. The processor 11 controls the repoling circuit 102 to generate a repoling voltage Vp in response to the repoling signal Sp. The processor 11 controls the selector 103 to select the driving voltage Vd or the repoling voltage Vp. The selector 103 applies the driving voltage Vd to the piezoelectric element 2 to generate the output current Io or to applies the repoling voltage Vp to the piezoelectric element 2 to repolarize the piezoelectric element 2.

The driving circuit 101 may be a sinusoidal pulse width modulation generator, but the present invention is not limited thereto.

Figures 2, 3:
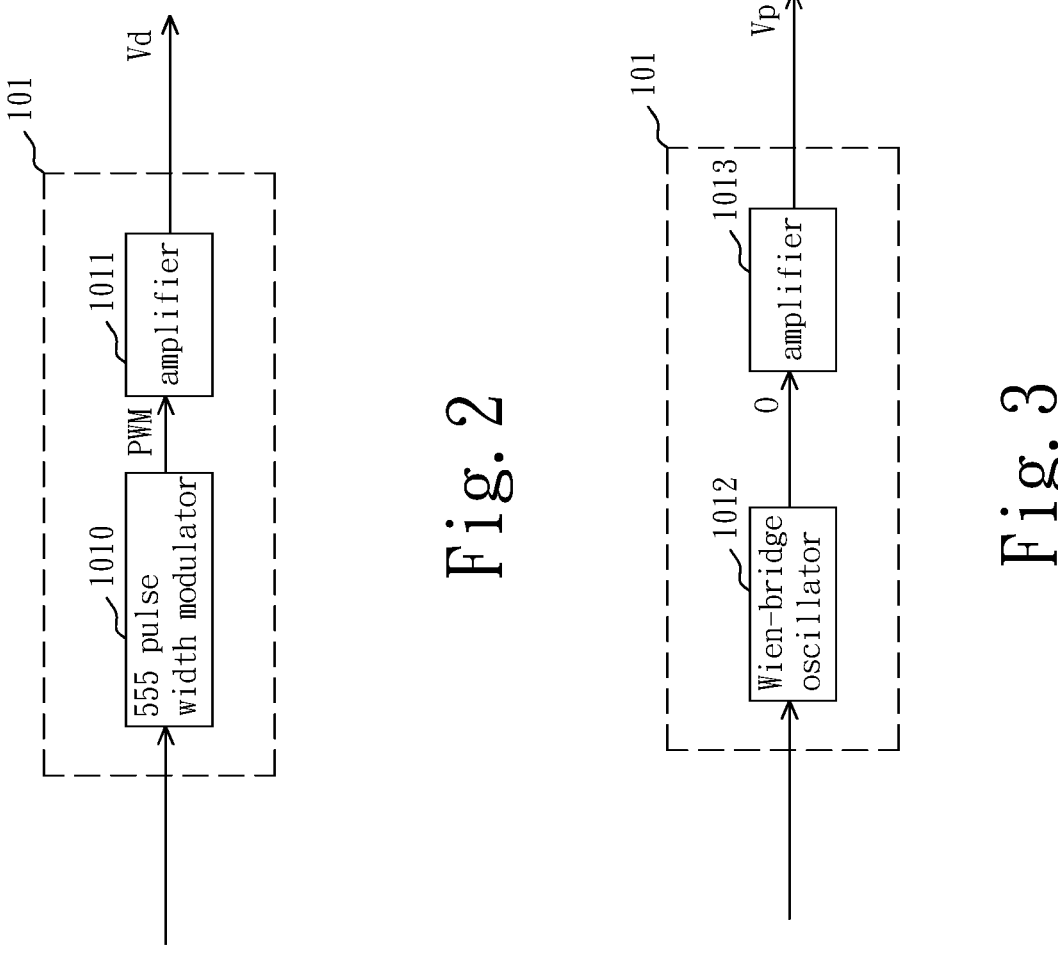
FIG. 2 is a schematic diagram illustrating a driving circuit according to an embodiment of the present invention.
FIG. 3 is a schematic diagram illustrating a driving circuit according to another embodiment of the present invention.

FIG. 2 is a schematic diagram illustrating a driving circuit according to an embodiment of the present invention. FIG. 3 is a schematic diagram illustrating a driving circuit according to another embodiment of the present invention. Referring to FIG. 1 and FIG. 2, the driving circuit 101 may include a 555 pulse width modulator 1010 and an amplifier 1011. The 555 pulse width modulator 1010 is coupled to the processor 11. The amplifier 1011 is coupled to the 555 pulse width modulator 1010 and the selector 103. The processor 11 controls the 555 pulse width modulator 1010 to generate a pulse width modulation signal PWM. The amplifier 1011 receives and amplifies the pulse width modulation signal PWM to generate the driving voltage Vd. Referring to FIG. 1 and FIG. 3, the driving circuit 101 may include a Wien-bridge oscillator 1012 and an amplifier 1013. The Wien-bridge oscillator 1012 is coupled to the processor 11. The amplifier 1013 is coupled to the Wien-bridge oscillator 1012 and the selector 103. The processor 11 controls the Wien-bridge oscillator 1012 to generate an oscillation signal O. The amplifier 1013 receives and amplifies the oscillation signal O to generate the driving voltage Vd.

Figure 4:
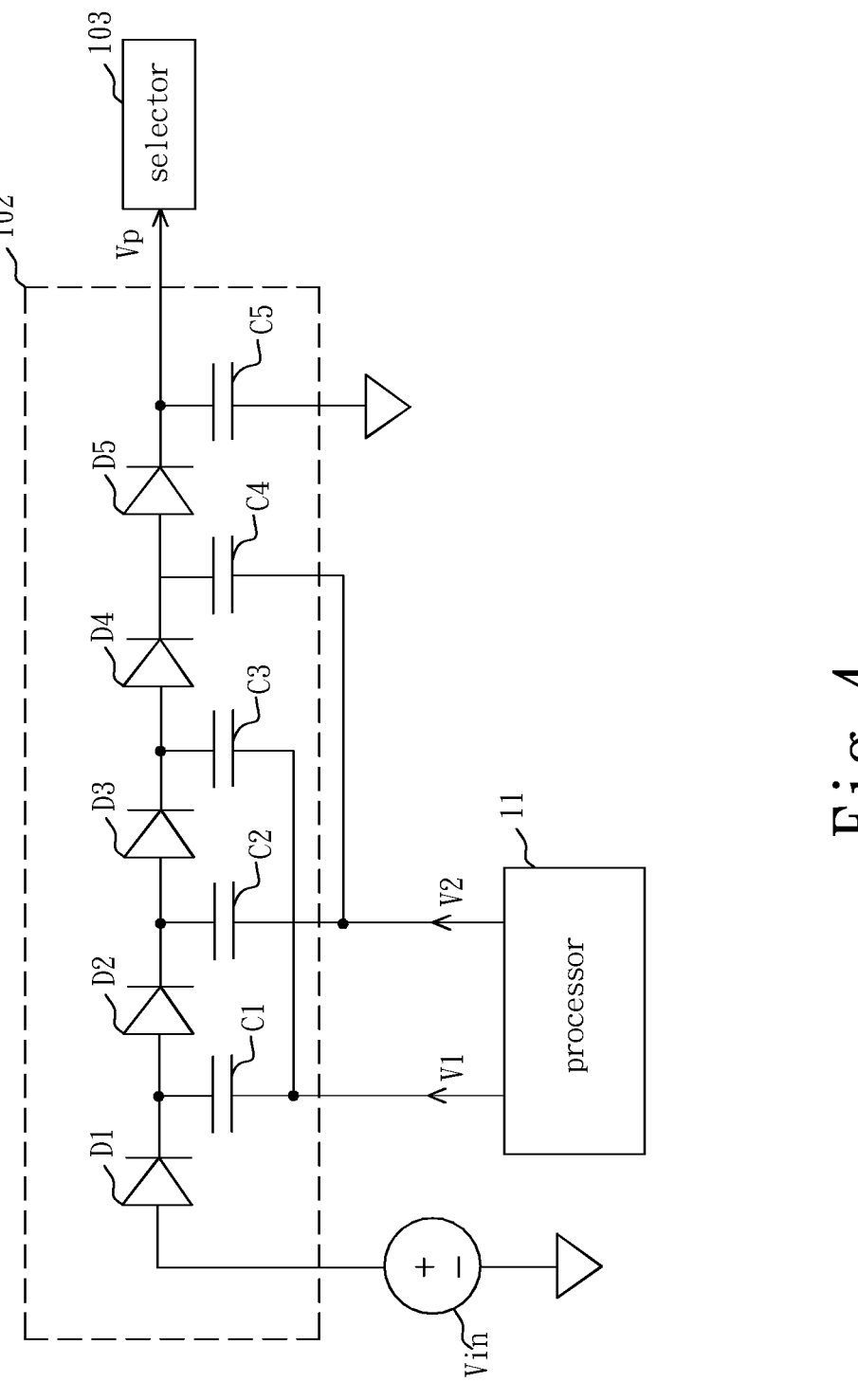
FIG. 4 is a schematic diagram illustrating a repoling circuit according to an embodiment of the present invention.
Figure 5:
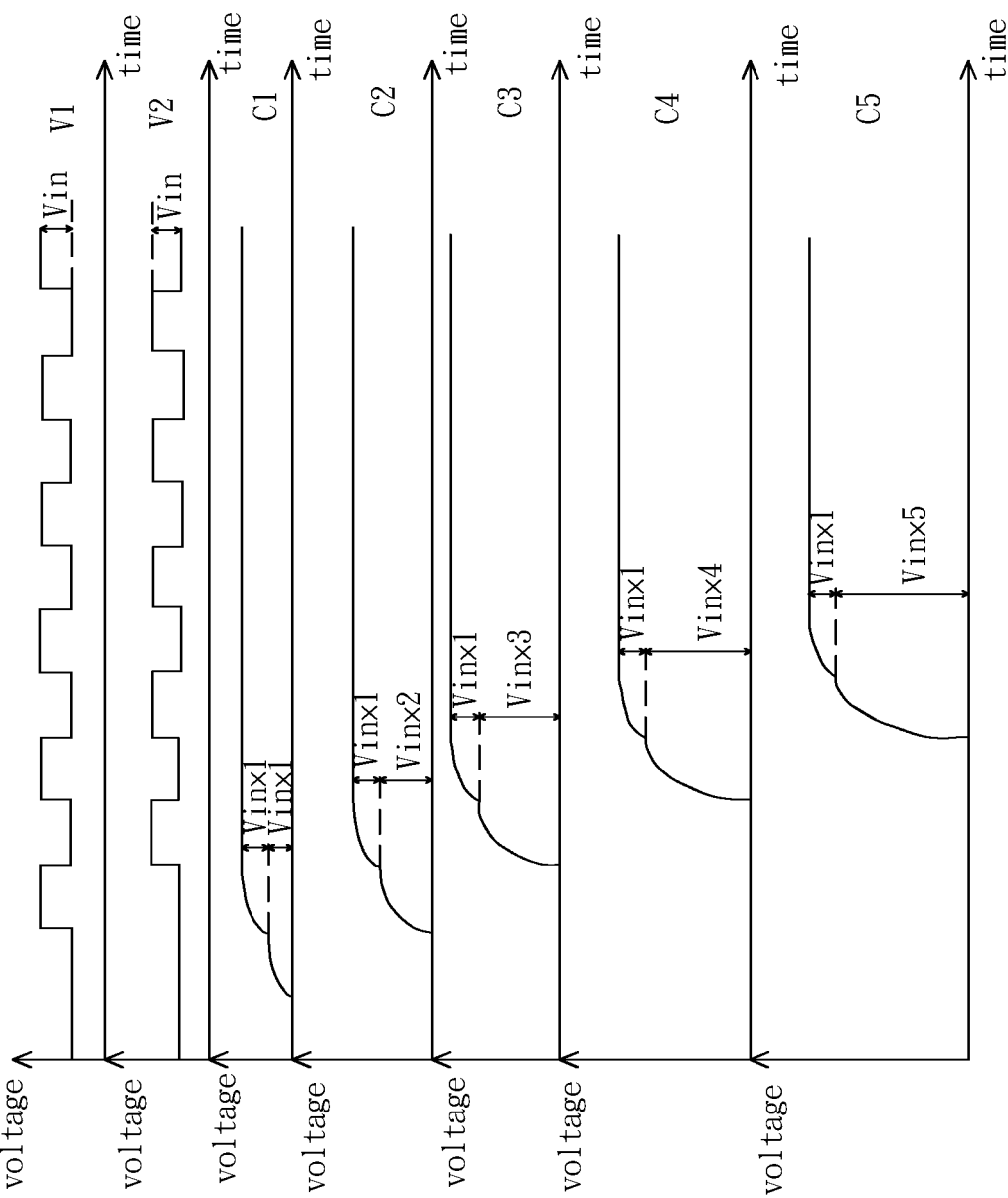
FIG. 5 is a diagram illustrating waveforms of signals of FIG. 4.

The repoling circuit 102 may be a charge pump, but the present invention is not limited thereto. FIG. 4 is a schematic diagram illustrating a repoling circuit according to an embodiment of the present invention. FIG. 5 is a diagram illustrating waveforms of signals of FIG. 4. As illustrated in FIG. 4 and FIG. 5, the charge pump includes capacitors C1, C2, C3, C4, and C5 and diodes D1, D2, D3, D4, and D5. The processor 11 provides a voltage signal V1 for the capacitors C1 and C3 and provides a voltage signal V2 for the capacitors C2 and C4. The capacitor C5 is grounded. The diode D1 receives a DC voltage Vin. The repoling circuit 102 receives the voltage signals V1 and V2 and the DC voltage Vin, thereby generating the repoling voltage Vp and providing the repoling voltage Vp for the selector 103. FIG. 5 shows the waveforms of the voltage signal V1 and V2 and the voltages across the capacitors C1, C2, C3, C4, and C5. A difference between the maximized voltage and the minimized voltage of each of the voltages V1 and V2 is equal to the DC voltage Vin. The maximized voltage across the capacitor C1 is 2Vin. The maximized voltage across the capacitor C2 is 3Vin. The maximized voltage across the capacitor C3 is 4Vin. The maximized voltage across the capacitor C4 is 5Vin. The maximized voltage across the capacitor C5 is 6Vin. The repoling voltage Vp is equal to 6Vin.

Figure 6:
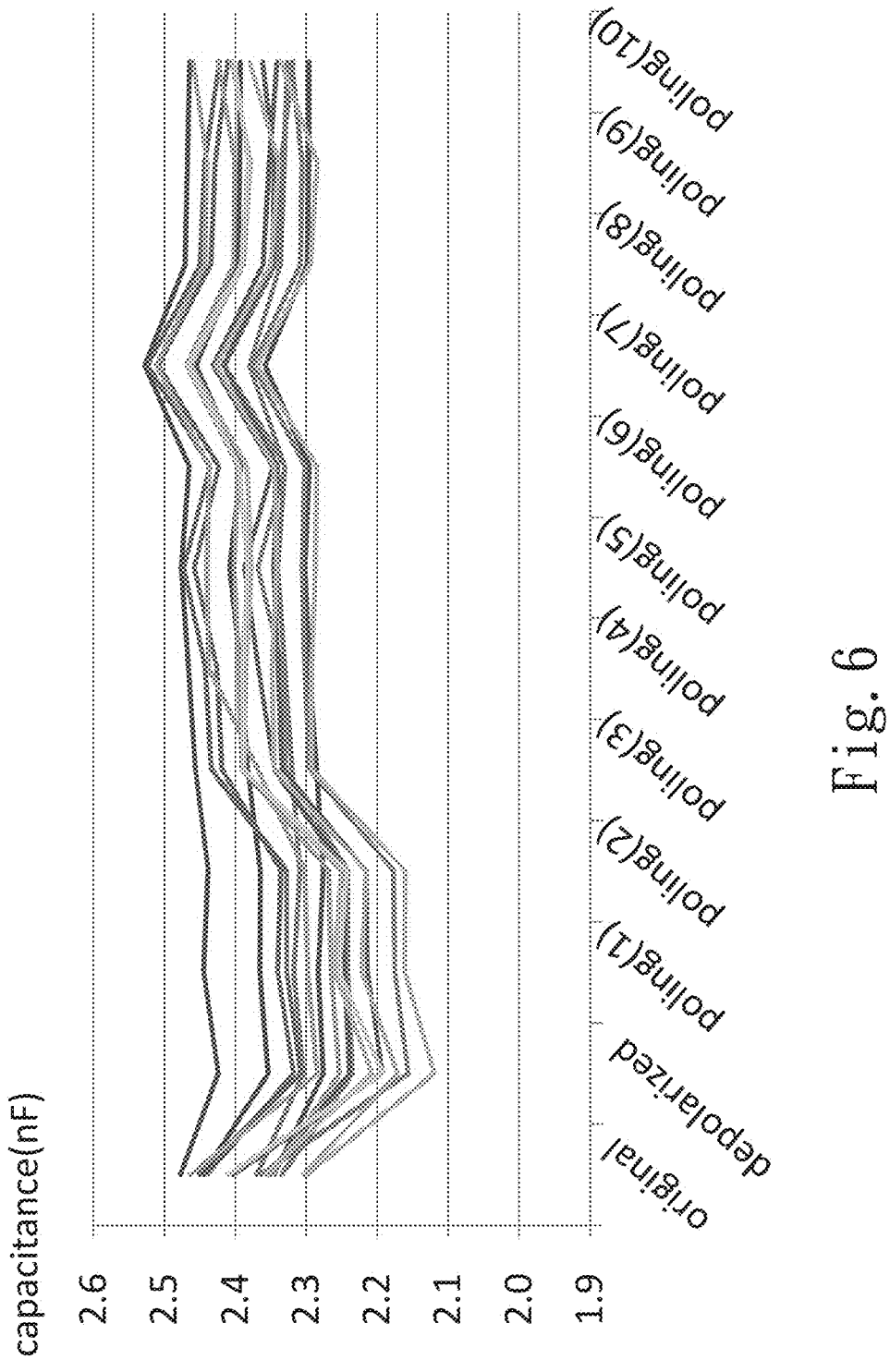
FIG. 6 is a diagram illustrating the curves of capacitance of piezoelectric products after 10 repoling treatments according to an embodiment of the present invention.
Figure 7:
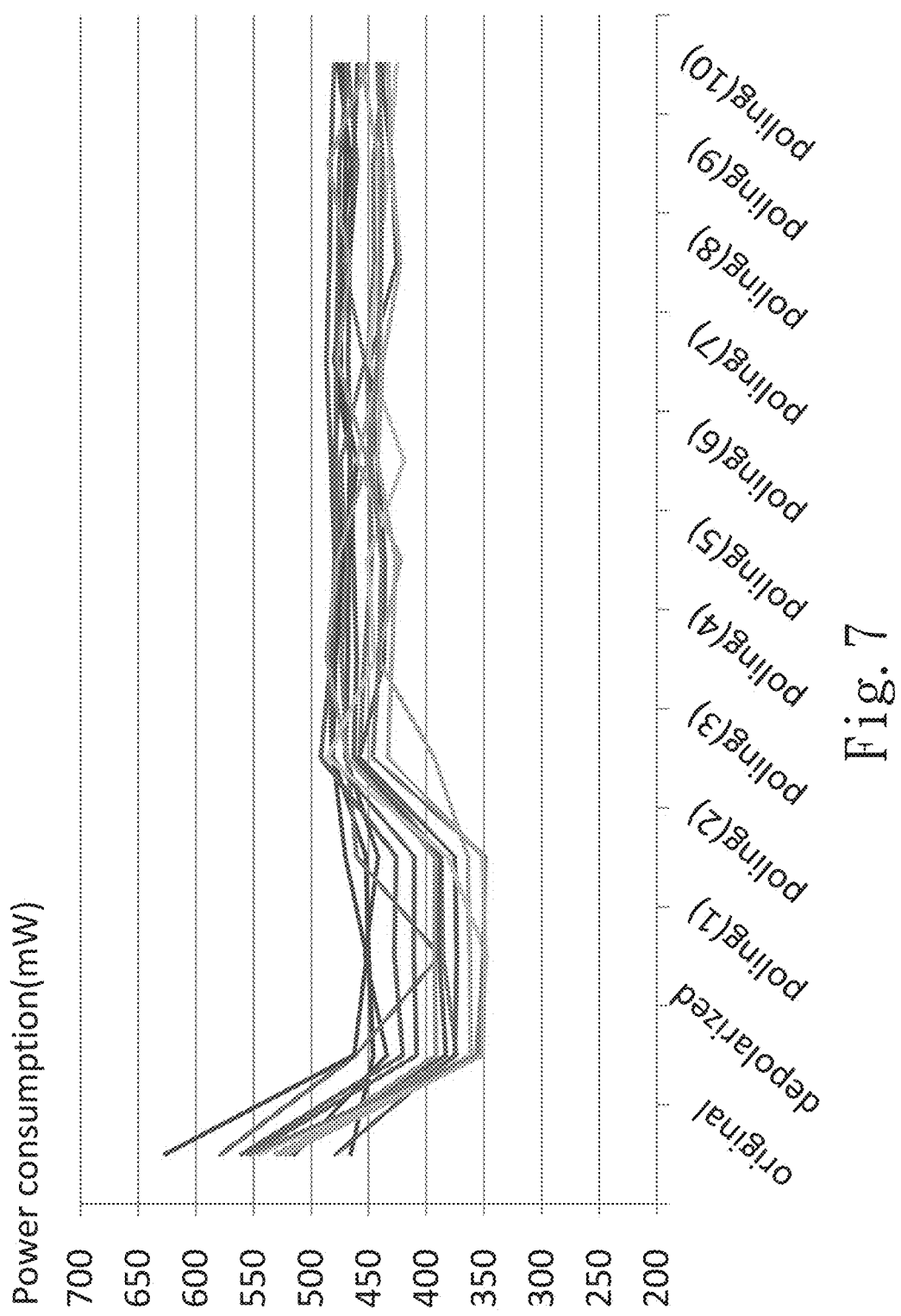
FIG. 7 is a diagram illustrating the curves of power consumption of piezoelectric products after 10 repoling treatments according to an embodiment of the present invention.

FIG. 6 is a diagram illustrating the curves of capacitance of piezoelectric products after 10 repoling treatments according to an embodiment of the present invention. FIG. 7 is a diagram illustrating the curves of power consumption of piezoelectric products after 10 repoling treatments according to an embodiment of the present invention. As illustrated in FIG. 6 and FIG. 7, in each repolarization treatment, the piezoelectric product is repolarized at 200 volts and −200 volts for 10 seconds. The piezoelectric product needs 20 seconds to recover the original piezoelectric properties.

Figure 8:
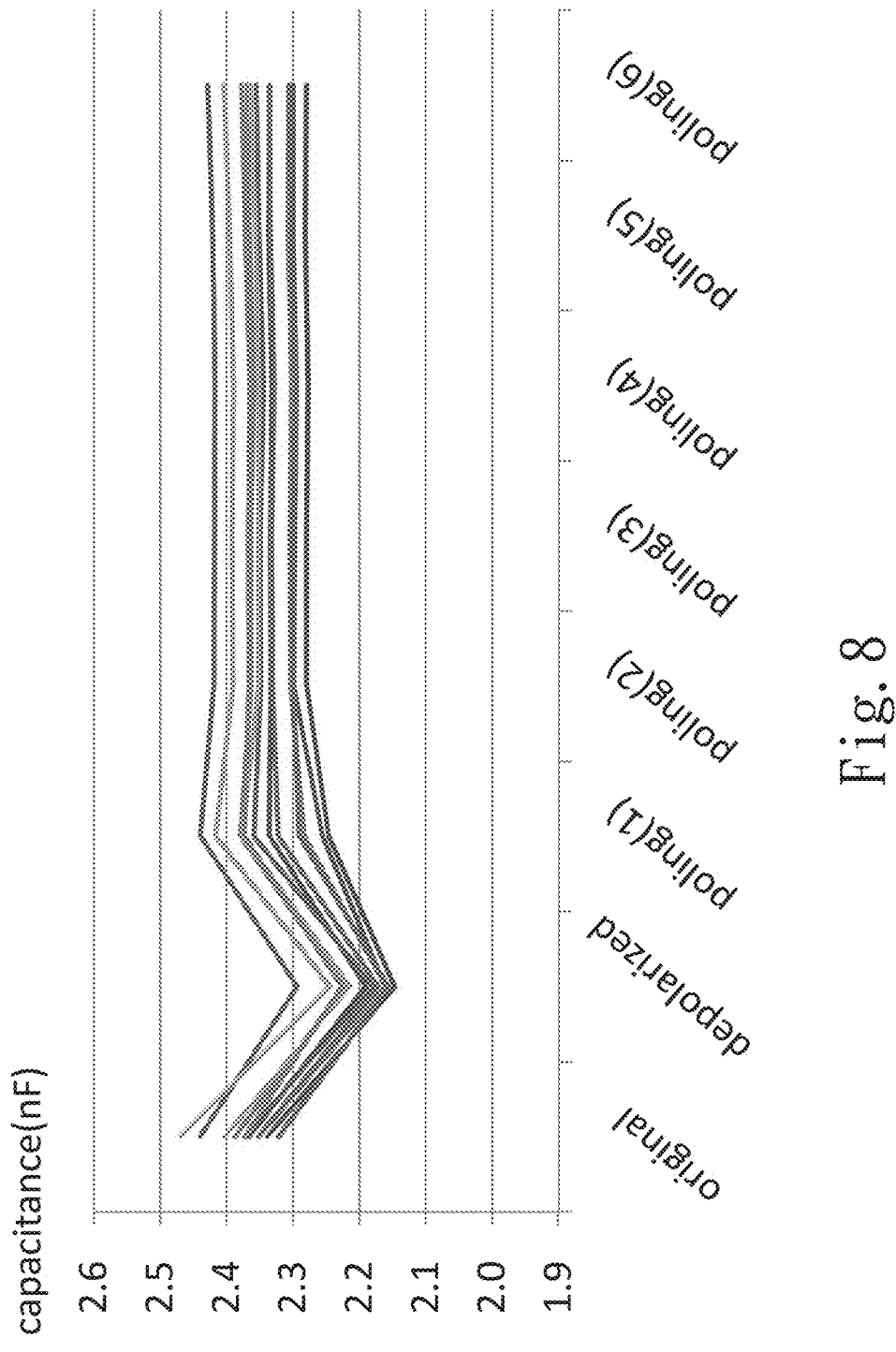
FIG. 8 is a diagram illustrating the curves of capacitance of piezoelectric products after 6 repoling treatments according to an embodiment of the present invention.
Figure 9:
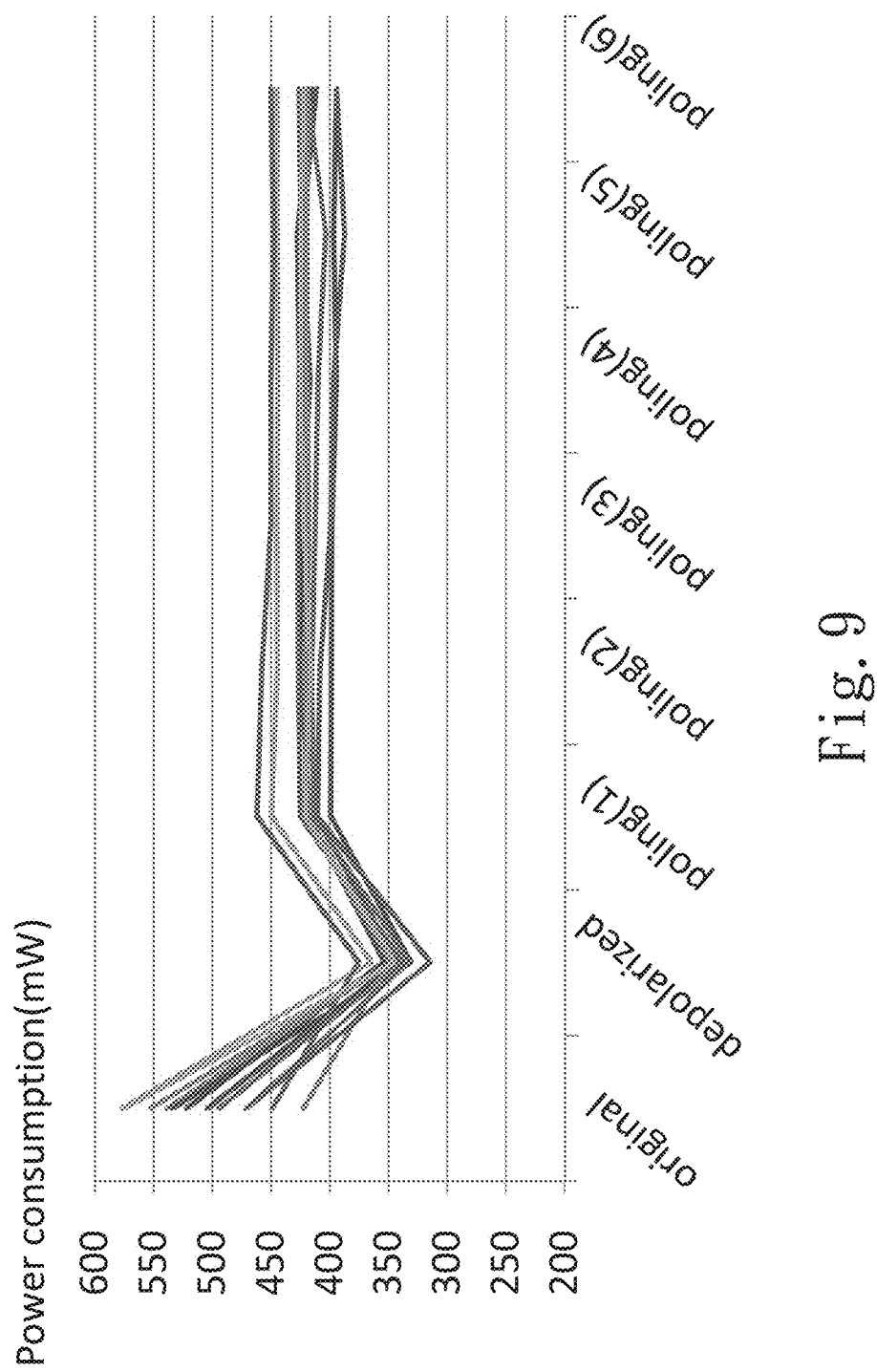
FIG. 9 is a diagram illustrating the curves of power consumption of piezoelectric products after 6 repoling treatments according to an embodiment of the present invention.

FIG. 8 is a diagram illustrating the curves of capacitance of piezoelectric products after 6 repoling treatments according to an embodiment of the present invention. FIG. 9 is a diagram illustrating the curves of power consumption of piezoelectric products after 6 repoling treatments according to an embodiment of the present invention. As illustrated in FIG. 8 and FIG. 9, in each repolarization treatment, the piezoelectric product is repolarized at 200 volts and −200 volts for 30 seconds. The piezoelectric product needs 30 seconds to recover the original piezoelectric properties.

According to the embodiments provided above, the repoling driving device and the driving method thereof repolarize the piezoelectric element to maintain the piezoelectric effect of the piezoelectric element when the piezoelectric is depolarized.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

8

What is claimed is:
1. A repoling driving device, coupled to a piezoelectric element, comprising:
   a piezoelectric driver coupled to the piezoelectric element;
   a processor coupled to the piezoelectric driver and configured to control the piezoelectric driver to generate a driving voltage, wherein the piezoelectric element is configured to receive the driving voltage to generate an output current; and
   a current detector coupled to the piezoelectric element and the processor and configured to receive the output current, wherein when the output current is less than a given current, the current detector generates a repoling signal and transmits the repoling signal to the processor, and the processor controls the piezoelectric driver to repolarize the piezoelectric element in response to the repoling signal,
   wherein the piezoelectric driver comprises:
      a driving circuit coupled to the processor, wherein the processor is configured to control the driving circuit to generate the driving voltage,
      a repoling circuit coupled to the processor, wherein the processor is configured to control the repoling circuit to generate a repoling voltage in response to the repoling signal, and
      a selector coupled to the piezoelectric element, the processor, the driving circuit, and the repoling circuit, wherein the processor is configured to control the selector to select the driving voltage or the repoling voltage, and the selector is configured to apply the driving voltage to the piezoelectric element to generate the output current or to apply the repoling voltage to the piezoelectric element to repolarize the piezoelectric element.

2. The repoling driving device according to claim 1, wherein the processor controls the piezoelectric driver to repolarize the piezoelectric element before the piezoelectric driver generates the driving voltage.

3. The repoling driving device according to claim 1, wherein the driving circuit is a sinusoidal pulse width modulation generator.

4. The repoling driving device according to claim 1, wherein the driving circuit comprises:
   a 555 pulse width modulator coupled to the processor, wherein the processor is configured to control the 555 pulse width modulator to generate a pulse width modulation signal; and
   an amplifier coupled to the 555 pulse width modulator and the selector and configured to receive and amplify the pulse width modulation signal to generate the driving voltage.

5. The repoling driving device according to claim 1, wherein the driving circuit comprises:
   a Wien-bridge oscillator coupled to the processor, wherein the processor is configured to control the Wien-bridge oscillator to generate an oscillation signal; and
   an amplifier coupled to the Wien-bridge oscillator and the selector and configured to receive and amplify the oscillation signal to generate the driving voltage.

6. The repoling driving device according to claim 1, wherein the repoling circuit is a charge pump.

7. The repoling driving device according to claim 1, wherein the selector is a multiplexer.

8. The repoling driving device according to claim 1, wherein the current detector comprises:

a current-to-voltage converter coupled to the piezoelectric element and configured to receive the output current and convert the output current into an output voltage; and a voltage comparator coupled to the current-to-voltage converter and the processor and configured to receive the output voltage and a given voltage corresponding to the given current, wherein when the output voltage is less than the given voltage, the voltage comparator generates the repoling signal.

9. The repoling driving device according to claim 1, wherein the processor is configured to control the piezoelectric driver to repolarize the piezoelectric element in response to the repoling signal at least two times.

10. The repoling driving device according to claim 1, wherein the driving voltage is a square-wave voltage or a sinusoidal-wave voltage.

11. The repoling driving device according to claim 1, wherein the piezoelectric element comprises quartz, tourmaline, zinc oxide, polymers, ceramic materials or composite materials.

* * * * *